(12) United States Patent
Yamazaki et al.

(10) Patent No.: US 12,400,901 B2
(45) Date of Patent: Aug. 26, 2025

(54) CONVEYANCE HAND WITH ATTRACTION PAD

(71) Applicant: CANON KABUSHIKI KAISHA, Tokyo (JP)

(72) Inventors: Katsumasa Yamazaki, Tochigi (JP); Hitoshi Sato, Tochigi (JP); Hideo Tanaka, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 929 days.

(21) Appl. No.: 17/547,342

(22) Filed: Dec. 10, 2021

(65) Prior Publication Data

US 2022/0199454 A1    Jun. 23, 2022

(30) Foreign Application Priority Data

Dec. 21, 2020 (JP) .................................. 2020-211562

(51) Int. Cl.
*H01L 21/687* (2006.01)

(52) U.S. Cl.
CPC .............................. *H01L 21/68707* (2013.01)

(58) Field of Classification Search
CPC ........... H01L 21/68707; H01L 21/6838; H01L 21/68259; B25J 15/0014
USPC .......................................... 294/213; 414/941
See application file for complete search history.

(56) References Cited

U.S. PATENT DOCUMENTS

| | | | | |
|---|---|---|---|---|
| 4,257,637 A * | 3/1981 | Hassan | .................. | B66C 1/0218 271/97 |
| 5,564,682 A * | 10/1996 | Tsuji | .................... | H01L 21/6838 269/21 |
| 6,152,677 A * | 11/2000 | Tateyama | .......... | H01L 21/67742 414/737 |
| 6,644,703 B1 * | 11/2003 | Levin | .................... | B25J 15/0616 279/3 |
| 6,942,265 B1 | 9/2005 | Boyd et al. | | |
| 7,081,946 B2 | 7/2006 | Hagiwara et al. | | |
| 7,406,759 B2 * | 8/2008 | Yamamoto | ........ | H01L 21/67132 156/247 |
| 8,991,887 B2 * | 3/2015 | Shin | ................... | H01L 21/67766 294/213 |
| 9,524,897 B2 * | 12/2016 | Jin | ..................... | H01L 21/68707 |
| 9,760,023 B2 * | 9/2017 | Toyomaki | ........... | G03F 7/70733 |

(Continued)

FOREIGN PATENT DOCUMENTS

| CN | 102709222 A | 10/2012 |
|---|---|---|
| CN | 102709223 A | 10/2012 |

(Continued)

OTHER PUBLICATIONS

Office Action issued in Taiwanese Appln. No. 110145604, dated Mar. 8, 2024. English translation provided.

(Continued)

*Primary Examiner* — Paul T Chin
(74) *Attorney, Agent, or Firm* — ROSSI, KIMMS & McDOWELL LLP

(57) ABSTRACT

A conveyance hand which conveys an object, includes a base, and a plurality of supports arranged on the base and configured to support the object. The plurality of supports include a first attraction pad configured to attract the object, and a second attraction pad configured to attract the object by a force weaker than the first attraction pad.

13 Claims, 9 Drawing Sheets

(56) References Cited

U.S. PATENT DOCUMENTS

| | | | |
|---|---|---|---|
| 9,991,152 B2 | 6/2018 | Ingram-Goble et al. | |
| 10,103,049 B2 * | 10/2018 | Bogner | B25J 15/0014 |
| 10,319,623 B2 * | 6/2019 | Matsuhira | G03F 7/70783 |
| 10,343,292 B2 | 7/2019 | Bogner | |
| 10,566,230 B2 * | 2/2020 | Abas | B25J 11/0095 |
| 2006/0157998 A1 | 7/2006 | Gershenzon et al. | |
| 2006/0181095 A1 * | 8/2006 | Bonora | H01L 21/6838 |
| | | | 294/183 |
| 2007/0195653 A1 * | 8/2007 | Yassour | B24B 37/30 |
| | | | 369/13.24 |
| 2015/0008690 A1 | 1/2015 | Kobuchi | |
| 2015/0086316 A1 | 3/2015 | Greenberg et al. | |
| 2016/0001449 A1 | 1/2016 | Pergande et al. | |
| 2016/0247706 A1 | 8/2016 | Ben-Natan | |

FOREIGN PATENT DOCUMENTS

| | | |
|---|---|---|
| CN | 102738056 A | 10/2012 |
| CN | 103367217 A | 10/2013 |
| CN | 104272449 A | 1/2015 |
| CN | 104275702 A | 1/2015 |
| CN | 204144235 U | 2/2015 |
| CN | 205526649 U | 8/2016 |
| CN | 107527848 A | 12/2017 |
| CN | 108364896 A | 8/2018 |
| JP | 2002305233 A | 10/2002 |
| JP | 2006289591 A | 10/2006 |
| JP | 2010150027 A | 7/2010 |
| JP | 2011125967 A | 6/2011 |
| JP | 2015103696 A | 6/2015 |
| JP | 2015516680 A | 6/2015 |
| JP | 2016538711 A | 12/2016 |
| JP | 2018206814 A | 12/2018 |
| JP | 2020161585 A | 10/2020 |
| KR | 1020060055633 A | 5/2006 |
| KR | 1020060133080 A | 12/2006 |
| KR | 1020090026831 A | 3/2009 |
| KR | 1020150006377 A | 1/2015 |
| KR | 1020160062095 A | 6/2016 |
| KR | 1020190046512 A | 5/2019 |
| TW | 201801236 A | 1/2018 |
| WO | 02065519 A1 | 8/2002 |

OTHER PUBLICATIONS

Office Action issued in Chinese Appln. No. 202111562504.9, mailed Mar. 28, 2025.

* cited by examiner

CONVEYANCE HAND WITH ATTRACTION PAD

BACKGROUND OF THE INVENTION

Field of the Invention

The present invention relates to a conveyance hand.

Description of the Related Art

In a conveyance apparatus for conveying, as an object to be transferred, a substrate such as a wafer used to manufacture a semiconductor device or a glass plate used to manufacture a liquid crystal display device, generally, the object is attracted and held by a conveyance hand including an attraction pad and conveyed. If the object is warped or distorted, the surface (surface to be attracted) of the object and the attraction surface of the attraction pad do not match upon attracting and holding the object, and a gap is formed. If air flows from this gap into the attraction pad, the attraction force of the attraction pad for the object lowers, and the satisfactory attraction holding state of the object cannot be maintained. To prevent this, there has been proposed a conveyance hand in which an attraction pad is supported by a spring structure or an elastic member, and the attraction surface of the pad is caused to conform to the shape of the surface of an object to be transferred, thereby matching the object with the attraction surface at the time of attraction and preventing air from flowing in (see Japanese Patent Application No. 2017-107066 and Japanese Patent Laid-Open No. 2015-103696).

In the structures of Japanese Patent Application No. 2017-107066 and Japanese Patent Laid-Open No. 2015-103696, since the structure of the attraction pad is complex, the thickness of the pad can increase. In this case, the conveyance hand may become thick, and an object to be transferred and the conveyance hand may interfere with another device or the like during conveyance of the object.

SUMMARY OF THE INVENTION

The present invention provides a technique advantageous in simplifying the structure of a conveyance hand configured to stably convey an object to be transferred.

One of aspects of the invention provides a conveyance hand configured to convey an object, comprising: a base; and a plurality of supports arranged on the base and configured to support the object, wherein the plurality of supports include a first attraction pad configured to attract the object, and a second attraction pad configured to attract the object by a force weaker than the first attraction pad.

Further features of the present invention will become apparent from the following description of exemplary embodiments with reference to the attached drawings.

DESCRIPTION OF THE EMBODIMENTS

Figure 1:
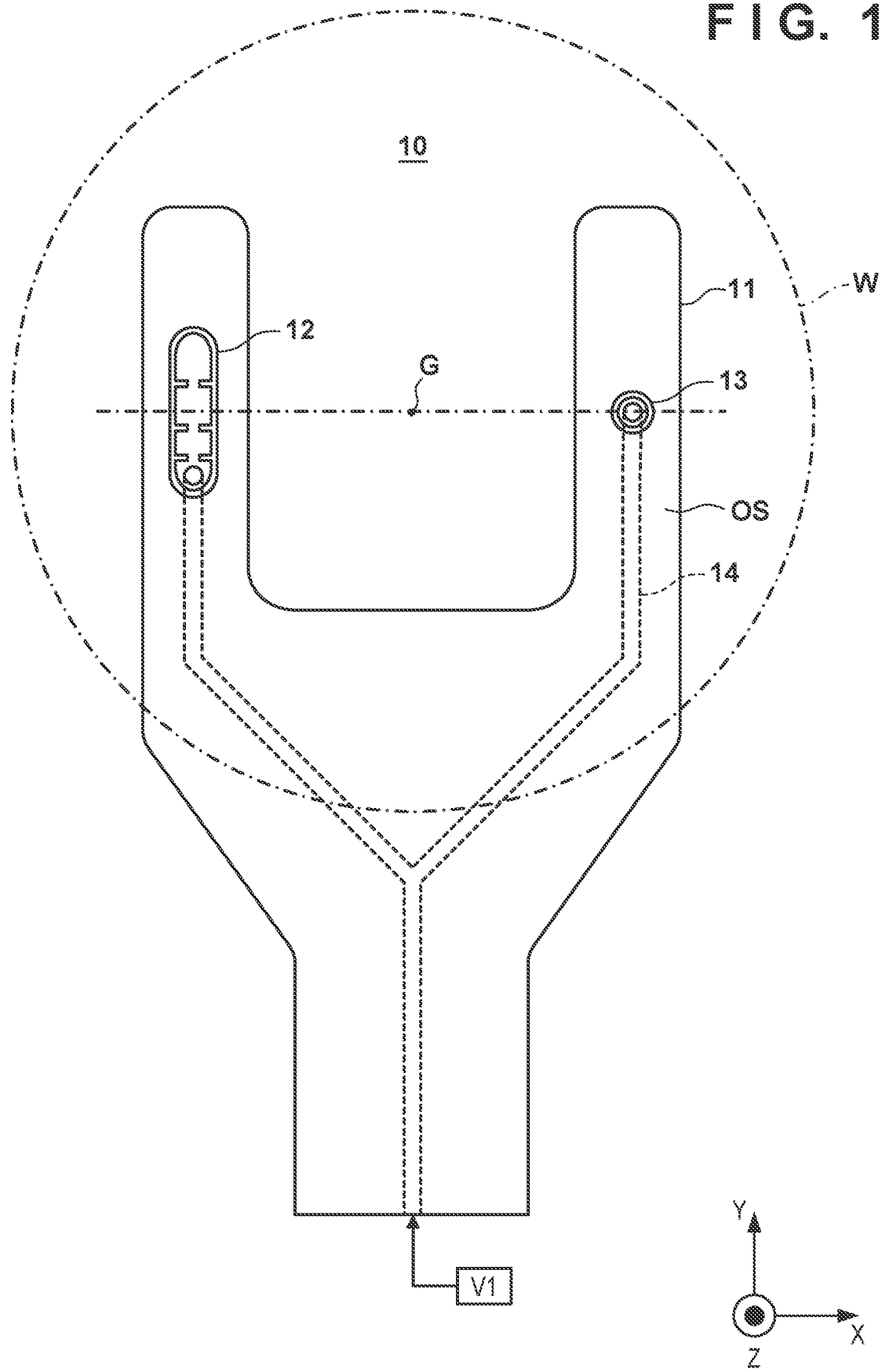
FIG. 1 is a schematic view showing the configuration of a conveyance hand according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In this specification, "attraction" means applying an attraction force to an object such as an object to be transferred. The attraction may be, for example, attraction using a pressure difference (for example, vacuum attraction), electromagnetic attraction using an electromagnetic force, electrostatic attraction using an electrostatic force, or attraction of another type.

FIG. 1 is a schematic view showing the configuration of a conveyance hand 10 according to an embodiment. The conveyance hand 10 can be attached to the movable portion of a conveyance apparatus that conveys an object W to be transferred (object). The object W can be, for example, a substrate such as a wafer used to manufacture a semiconductor device or a glass plate used to manufacture a liquid crystal display device. The conveyance hand 10 holds the object W by attracting the object W. The conveyance hand 10 includes a facing surface OS facing the object W. In this specification and the drawings, directions are shown on an XYZ coordinate system in which a plane parallel to the facing surface OS is defined as an X-Y plane, and a direction orthogonal to the facing surface OS is defined as a Z-axis.

As shown in FIG. 1, the conveyance hand 10 can include a base 11 that forms the main body of the conveyance hand 10, and a first attraction pad 12 and a second attraction pad 13, which serve as a plurality of supports arranged on the base 11. The conveyance hand 10 can include a line configured to give an attraction force to the first attraction pad 12 and the second attraction pad 13. In an example, the line is an air channel 14 that communicates with the first attraction pad 12 and the second attraction pad 13, and an attraction force supply source V1 can be connected to the air channel 14. The attraction force supply source V1 includes, for example, a vacuum pump and a control valve and can provide a negative pressure to the first attraction pad 12 and the second attraction pad 13. The first attraction pad 12 and the second attraction pad 13 can come into contact with the back surface of the object W to support the object W and apply an attraction force by the negative pressure to the object W. The first attraction pad 12 and the second attraction pad 13 can be arranged such that a gravity center position G of the object W is arranged between the first attraction pad 12 and the second attraction pad 13. The facing surface OS faces the object W in a state in which the object W is supported by the plurality of supports (in this example, the first attraction pad 12 and the second attraction pad 13). In an example, the maximum size of the second attraction pad 13 in a direction parallel to the facing surface OS (or the X-Y plane) is smaller than that of the first attraction pad 12.

Figure 2A:
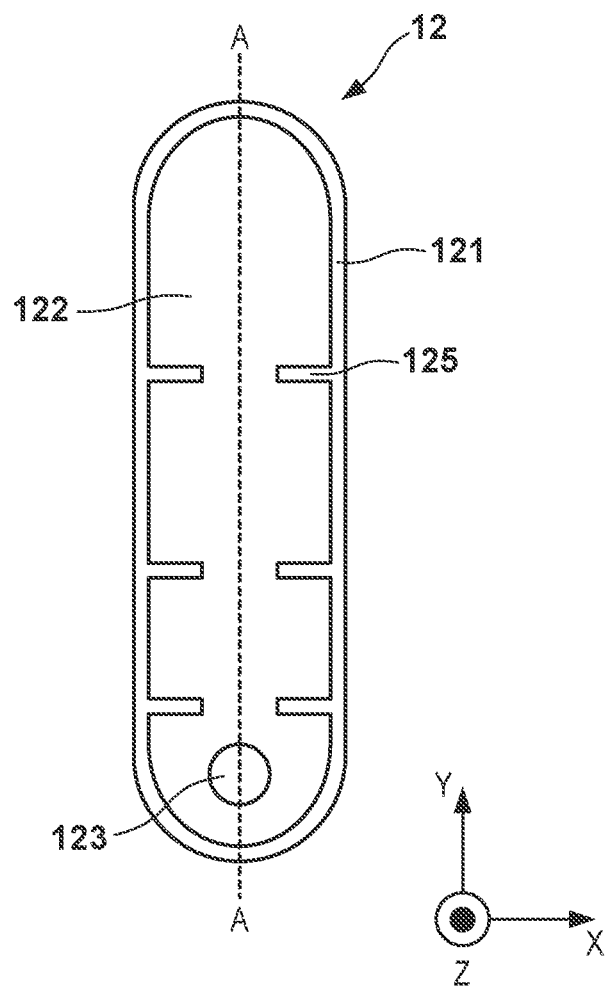
FIG. 2A is a schematic plan view showing the configuration of a first attraction pad.
Figure 2B:
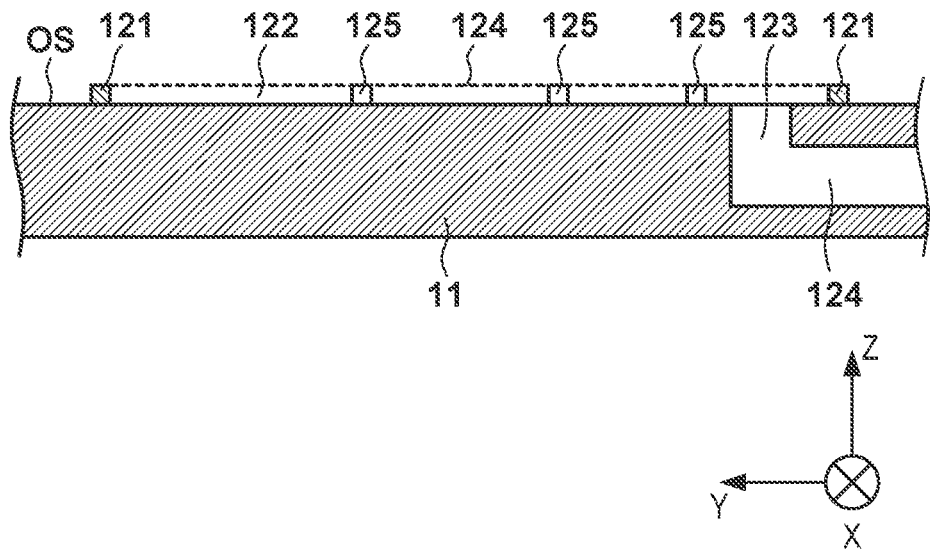
FIG. 2B is a schematic sectional view showing the configuration of the first attraction pad.

FIG. 2A is a plan view of the first attraction pad 12. FIG. 2B is a sectional view taken along a line A-A in FIG. 2A. The first attraction pad 12 can include a convex portion (bank) 121 that supports the object W. The convex portion 121 can be configured to surround an attraction space (attraction groove) 122 in which the pressure is reduced by the attraction force supply source V1 for attraction of the object W. The convex portion 121 includes a contact surface that comes into contact with the object W when holding the object W. The first attraction pad 12 can also include an attraction hole 123 that communicates with the attraction space 122. The attraction hole 123 communicates with the air channel 14. Here, a region formed by the upper surface of the convex portion 121 in the Z direction and a portion surrounded by the upper surface is defined as a holding surface 124. The attraction space 122 may be provided with obstructions 125 that restrict attraction of air. The obstructions 125 may have the same height (the size in the Z direction) as the convex portion 121, or may have a height (the size in the Z direction) smaller than the convex portion 121. The obstructions 125 can be arranged to define, in the attraction space 122, a plurality of partial spaces (four partial spaces in the example shown in each of FIGS. 5A and 5B) partially partitioned from each other by the obstructions 125.

Figure 3A:
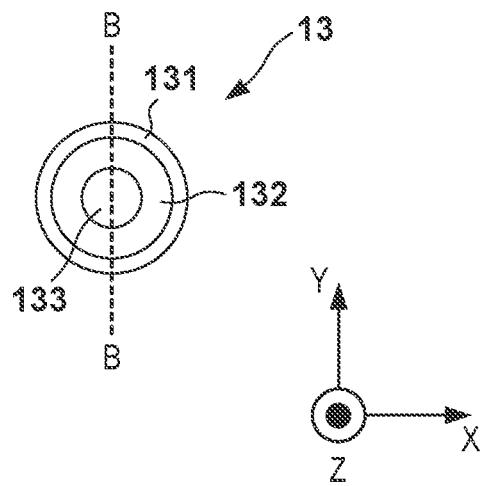
FIG. 3A is a schematic plan view showing the configuration of a second attraction pad.
Figure 3B:
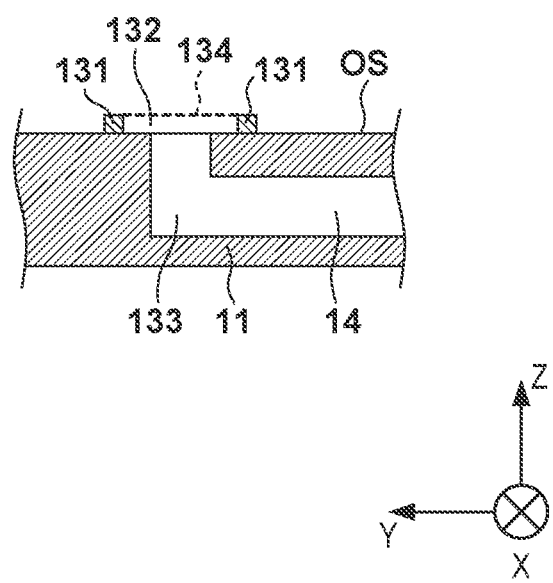
FIG. 3B is a schematic sectional view showing the configuration of the second attraction pad.

FIG. 3A is a plan view of the second attraction pad 13. FIG. 3B is a sectional view taken along a line B-B in FIG. 3A. Like the first attraction pad 12, the second attraction pad 13 can include a convex portion (bank) 131 that supports the object W. The convex portion 131 can be configured to surround an attraction space (attraction groove) 132 in which the pressure is reduced by the attraction force supply source V1 for attraction of the object W. The convex portion 131 includes a contact surface that comes into contact with the object W when holding the object W. The second attraction pad 13 can also include an attraction hole 133 that communicates with the attraction space 132. The attraction hole 133 communicates with the air channel 14. Here, a region formed by the upper surface of the convex portion 131 in the Z direction and a portion surrounded by the upper surface is defined as a holding surface 134.

In an example, the distance from the center of the holding surface 134 to the outer edge of the holding surface 134 is smaller in all directions than the distance from the center of the holding surface 124 to the outer edge of the holding surface 124. In an example, the area of the attraction space 132 (the area on a plane parallel to the X-Y plane) is smaller than the area of the attraction space 122 (the area on a plane parallel to the X-Y plane). In other words, the area (the area of the holding surface 124) surrounded by the outer edge of the region where the second attraction pad 13 comes into contact with the object W is smaller than the area (the area of the holding surface 134) surrounded by the outer edge of the region where the first attraction pad 12 comes into contact with the object W. Also, in an example, the distance from the center of the attraction space 132 to the outer edge of the attraction space 132 is smaller in all directions than the distance from the center of the attraction space 122 to the outer edge of the attraction space 122.

In general, when an object to be transferred is conveyed by the conveyance hand, the object needs to be held by the conveyance hand such that the object is not moved on the conveyance hand by the force applied to the object at the time of conveyance. To hold the object, the plurality of supports (attraction pads) need to cancel the influence of both of the force of a translation component and the force of a rotation component by the holding force. When holding the object, the attraction force of the attraction pads is mainly used as the holding force.

As for the force of the rotation component, since the attraction pads are apart from the gravity center position of the object, it may be impossible to cancel the whole influence of the force of the translation component by the holding force of the attraction pads. If the holding force of one attraction pad is sufficiently large, the other attraction pad need only cancel the force whose influence cannot be canceled, that is, the force of the rotation component. Depending on the arrangement of the attraction pads and the arrangement of the object, for example, when the attraction pad with the larger holding force is arranged at a position closer to the gravity center position of the object, the force that cancels the influence of the force of the rotation component can be made small. In this embodiment, the holding force of the first attraction pad 12 for the object W is larger than the holding force of the second attraction pad 13 for the object W. In other words, the second attraction pad 13 holds the object W by a holding force smaller than that of the first attraction pad 12. Here, making the size of the convex portion 121 of the first attraction pad 12 large on the X-Y plane is advantageous in increasing the force that cancels the influence of the force of the rotation component. This can reduce the holding force required of the second attraction pad 13.

Using an attraction force $F_P$, a load $F_G$ received from the object W, and a friction coefficient $\mu$ between the attraction pad (convex portion) and the object W, a maximum holding force F of the attraction pad can be expressed as $$F = \mu \times (F_P + F_G)$$

Depending on the conveyance conditions such as the conveyance direction and the conveyance speed of the object, it is possible to hold the object only by the friction holding force ($\mu \times F_G$) by the load. On the other hand, in recent years, to improve the throughput of an entire semiconductor manufacturing apparatus, the conveyance speed is increased, and the attraction pad cannot be arranged at a position close to the gravity center position. Hence, each attraction pad is required to have a larger holding force. To increase the holding force, it is necessary to use not only the holding force by the load but also the holding force by the attraction force. To obtain a large holding force by the attraction pad, for example, if a negative pressure is used for attraction, the negative pressure in the attraction pad needs to be kept high.

On the other hand, if the object is arranged on the conveyance hand to convey the object by the conveyance hand, the parallelism between the object and the attraction surface may become large in a non-attraction state due to the warp and distortion of the object. Here, as for the parallelism, it means that the larger the value of parallelism is, the larger the deviation from the parallel state between two surfaces. If the parallelism is large at the time of attraction of the object, a gap is formed between the object and the attraction surface. In air attraction, air flows into the attraction space via the gap. If air flows into the attraction space, it may be impossible to ensure the negative pressure needed to attract and hold the object in the attraction pad, that is, the attraction force. In addition, if air in the attraction spaces of a plurality of attraction pads is attracted by a single attraction force supply source, the negative pressure may lower even in the attraction pad in which air does not flow into the attraction space, and conveyance of the object by the attraction force may be more disadvantageous.

The parallelism between the object and the attraction surface readily occurs when the number of attraction pads is large. This is because the influence of the warp and distortion of the object appears as parallelisms different from each other in each of the plurality of attraction pads. As for the contact between the object and the plurality of attraction pads, surface contact between the object and the attraction surface of the attraction pad that is most likely to obtain surface contact starts. The attraction pad that readily obtains surface contact can mainly be determined by the attraction force, the shape of the attraction pad, and the parallelism between the object and the attraction pad before the start of attraction. In the surface contact between the object and the attraction surface of the first attraction pad, only a force for tilting the object and deforming the object a little such that it obtains a shape capable of coming into contact with the attraction surface, that is, a force for correcting the object is necessary. This force is caused by the attraction force by the negative pressure of the attraction pad. On the other hand, in the surface contact between the object and the attraction surface of the second or subsequent attraction pad, a stronger attraction force (negative pressure) is needed. This can occur when the deviation between the object and the attraction surface of another attraction pad is increased by the surface contact between the object and the attraction surface of the first attraction pad. In addition, to bring the attraction surface of the second or subsequent attraction pad into surface contact with the object, the object needs to be deformed in conformity with the attraction surface of the first attraction pad and the attraction surface of the second or subsequent attraction pad.

When the attraction surface of the first attraction pad and the object are in surface contact, the parallelism between the attraction surface of the second attraction pad and the object becomes large. For this reason, air readily flows into the attraction space of the second attraction pad, and it is difficult to ensure the negative pressure and ensure the force for correcting the object in conformity with the attraction surface of the second attraction pad. Hence, it is conventionally considered to increase the attraction force of each of the plurality of attraction pads in order to stably hold the object by the plurality of attraction pads. For example, in Japanese Patent Application No. 2017-107066, each attraction pad is allowed to be deformed such that the attraction surface of each attraction pad conforms to an object to be transferred. Hence, each attraction surface comes into surface contact with the object, the negative pressure can be maintained, and a sufficient attraction holding force is maintained.

On the other hand, in an apparatus using a conveyance hand, the size of the conveyance hand is sometimes limited to prevent interference between the conveyance hand and another structure. The size limitations include limitations concerning the thickness. If the pad structure of Japanese Patent Application No. 2017-107066 or Japanese Patent Laid-Open No. 2015-103696 is employed, the pad becomes thick. Hence, a conveyance hand advantageous in making an attraction pad thin and capable of holding an object to be transferred by a sufficient attraction force is demanded. If the thickness is not limited, such a conveyance hand may incorporate a mechanism that makes the attraction pad movable, as a matter of course.

The advantages of the conveyance hand 10 according to this embodiment will be described below. When the conveyance hand 10 holds the object W, if the warp and distortion of the object W are small, both the attraction surface 124 of the first attraction pad 12 and the attraction surface 134 of the second attraction pad 13 come into surface contact with the object W. On the other hand, if the warp and distortion of the object W are large, neither of the attraction surface 124 of the first attraction pad 12 nor the attraction surface 134 of the second attraction pad 13 can be brought into surface contact with the object W. According to the configuration of the conveyance hand 10 of this embodiment, the attraction surface that does not come into surface contact with the object W is the attraction surface 134 of the second attraction pad 13 in many cases. This is because the attraction surface 124 of the first attraction pad 12 has a configuration that readily comes into surface contact with the object W as compared to the attraction surface 134 of the second attraction pad 13.

As shown in FIG. 1, the area of the attraction space 122 of the first attraction pad 12, where the negative pressure is formed, is larger than the area of the attraction space 132 of the second attraction pad 13. This allows the attraction pad 12 readily obtains a large attraction force (and holding force) as compared to the attraction pad 13. In addition, the size of the attraction surface 124 is larger than that of the attraction surface 134 in the tangent direction of a virtual circle with respect to the gravity center position G as the center in a direction along the X-Y plane. For this reason, even in a non-attraction state, the attraction surface 124 of the first attraction pad 12 easily supports the object W at a plurality of points or by the surface as compared to the attraction surface 134 of the second attraction pad 13. For example, if the attraction surface 124 of the first attraction pad 12 supports the object W at two points, the parallelism between the attraction surface 124 and the object W can easily be made small. When the parallelism is small, an attraction force necessary for tilting or correcting the object W in conformity with the attraction surface 124 can be made small. Hence, at the start of attraction, the attraction surface 124 of the first attraction pad 12 readily attracts and holds the object W before the attraction surface 134 of the second attraction pad 13.

On the other hand, in the structure of the conveyance hand 10 according to this embodiment, the attraction surface 134 of the second attraction pad 13 is configured to hardly come into surface contact with the object W. Hence, surface contact between the object W and the attraction surface 134 is difficult to occur, and air can flow into the attraction space 132. When air flows into the attraction space 132, the negative pressure in the first attraction pad 12 and the second attraction pad 13 lowers (that is, becomes close to the atmospheric pressure). In the configuration with the small attraction surface 134, however, the gap formed between the attraction surface 134 and the object W is small, too. For this reason, a great pressure loss by the attraction surface 134 and the object W occurs in the air that is going to flow into the attraction space 132. Since the amount of air flowing into the attraction space 132 is restricted by the pressure loss, the lowering of the negative pressure in the first attraction pad 12 and the second attraction pad 13 is limited.

As described above, if the influence (that is, translation and rotation) of both of the translation component and the rotation component of the force received at the time of conveyance of the object W can be canceled by the holding force, the object W can be conveyed without being translated and rotated with respect to the conveyance hand 10. Hence, the area of the attraction space 122 of the first attraction pad 12 can be decided in accordance with the conveyance conditions such that the necessary amount of negative pressure (attraction force) can be ensured, and the object W can be held by the holding force that cancels the influence of the force of the translation component by the negative pressure. In addition, the area of the attraction space 132 of the second attraction pad 13 can be decided such that the object W can be held by the holding force that cancels the influence of the force of the rotation component.

This makes it possible to hold and convey the object W without translating and rotating the object W with respect to the conveyance hand 10. According to this embodiment, the object W can stably be held by the first attraction pad 12 and the second attraction pad 13, and the structures of the first attraction pad 12 and the second attraction pad 13 can be simplified. In particular, concerning the Z direction, a space corresponding to the height of the convex portion 121 and the convex portion 131 suffices. For this reason, this embodiment is advantageous in reducing the thickness of the conveyance hand 10 while ensuring the holding force for the object W. Simplifying the structures is also advantageous in reducing the production cost of the conveyance hand 10, improving the productivity, and improving the durability.

More detailed examples of the configuration of the conveyance hand 10 will be described below. The number of attraction pads is not limited to two. However, the number of attraction pads is preferably two unless other great factors of tradeoff, such as the difficulty in supporting the object W, exist. This is because if three or more attraction pads exist, and the attraction surface of one attraction pad comes into surface contact with the object W, it is difficult to bring the attraction surfaces of the remaining two or more attraction pads into surface contact with the object. Since this makes air flow into the attraction spaces of the remaining two or more attraction pads, the negative pressure in the attraction space of each attraction pad more readily lowers. Note that this problem can be avoided by providing a plurality of channels of air. However, the structure becomes complex, resulting in disadvantages in terms of versatility and cost. Also, if the number of attraction pads is increased, the support points of the object W are distributed to those attraction pads, and inconvenience readily takes place in surface contact of the attraction pad that comes into surface contact first. However, the problem posed by the increase of the number of attraction pads can be solved by arranging the plurality of attraction pads closely. In addition, if the tendency of the shape of the warp and distortion of the object is defined, or if the object is deformed by the weight of its own and can be supported at three or more support points, three or more attraction pads may be provided.

The attraction surface 134 of the second attraction pad 13 is preferably much smaller than the attraction surface 124 of the first attraction pad 12. This is because if the attraction surface 134 of the second attraction pad is large, the gap between the attraction surface 134 and the object W becomes large, and the negative pressure lowers. On the other hand, the attraction force depends on the magnitude of the negative pressure and the area of the attraction groove 132. To prevent reduction of the negative pressure, the width of the convex portion 131 should sufficiently be ensured such that the gap between the attraction surface 134 and the object W becomes small, and a pressure loss region that restricts the inflow of air to the attraction space 132 is formed. That is, the size of the attraction surface 134, the width of the convex portion 131, the area of the attraction space 132, and the like can be decided in accordance with the attraction force required of the attraction pad 13. To easily obtain the effects of this embodiment, the conveyance hand 10 is preferably designed to make the attraction surface 134 small. Note that depending on the conveyance conditions including the size of the warp and distortion of the object W, the attraction surface 134 becomes large, but it may be necessary to increase the width of the attraction support 131 or increase the area of the attraction space 132.

If the relative positions of the attraction surface 134 and the object before the start of attraction are unknown or indefinite, the structure of the attraction pad 13 is preferably point-symmetric with respect to a line parallel to the Z-axis. For example, the attraction surface 134 and the like can have a circular shape. This is advantageous in reducing the gap between the attraction surface 134 and the object and suppressing inflow of air to the attraction space 132 regardless of the position where the object is supported on the attraction surface 134.

On the other hand, for example, if all objects warp point-symmetrically with respect to the gravity center position, the attraction surface 134 may have a structure long in the circumferential direction with respect to the gravity center position G as the center and short in the radial direction. This is advantageous in making the gap small because the direction in which the gap of the attraction surface 134 changes is set along the radial direction of the object. This can increase the area of the attraction space 132 that forms the negative pressure and increase the attraction force of the second attraction pad 13. If the area of the attraction space 132 of the attraction pad 13 is small, the whole region of the attraction space 132 may be the region of the attraction hole 133.

In consideration of the size of the object W and the arrangement accuracy of the object W on the conveyance hand 10, it is preferable that the attraction surface 124 can arrange the object W in good balance without dropping the object W in a non-attraction state. Hence, the attraction surface 124 may have a shape long in one or a plurality of directions on the X-Y plane. For example, the attraction surface 124 may have a shape long in the long-axis direction of the base 11 or a shape long in the circumferential direction with respect to the gravity center position G as the center, or may be long in a direction orthogonal to a virtual line that passes through the center of the first attraction pad 12 and the center of the second attraction pad 13. The attraction surface 124 preferably has a size large in the tangent direction of a circle with its starting point at the gravity center position G so as to easily support the object W before attraction.

As shown in FIG. 2A, the first attraction pad 12 can include the obstructions 125 in the convex portion 121. The obstructions 125 can cause a pressure loss to restrict the inflow of air to the attraction hole 123. Hence, pressure reduction in the attraction space 122 of the attraction pad 12 can sequentially be performed in a plurality of partial spaces partially partitioned by the obstructions 125. Since this makes it possible to correct the shape of the object W stepwise, the gap between the attraction surface 124 and the object W can be made small stepwise. This is advantageous in facilitating surface contact between the object W and the attraction surface 124. The number and arrangement of the obstructions 125 and the interval between the obstructions 125 can be decided in accordance with the size of the warp and distortion of the object W. For example, the area of a partial space (a partial space closest to the attraction hole 123) where the pressure is reduced first and the obstructions 125 therefor can be decided such that a portion of the attraction surface 124, which faces the partial space, comes into surface contact with the object W by the attraction force caused by the negative pressure in the partial space. This is advantageous in partially bringing the attraction surface 124 and the object W into surface contact with each other at an earlier timing after the start of attraction. This makes it possible to bring the attraction surface 124 of the first attraction pad 12 into surface contact with the object W before the adverse effect that the attraction surface 134 of the second attraction pad 13 gives to the surface contact between the object W and the attraction surface 124 of the first attraction pad 12 becomes large.

In addition, the obstructions 125 can allow the gap to temporarily become large at one end of the attraction surface 124 of the first attraction pad 12 in the longitudinal direction in a non-attraction state due to the arrangement of the attraction pad 12 and the shape of the warp and distortion of the object W. In this case, it is possible to sequentially reduce the pressure in the partial spaces partially partitioned by the obstruction 125 in the attraction space 122 of the attraction pad 12 and sequentially make the gap small on the plurality of partial spaces. Accordingly, the gap gradually becomes small even in a portion where the gap is large in the initial state, and the pressure loss caused by this reduces the inflow of air and facilitates pressure reduction in the partial spaces. Hence, surface contact between the attraction surface 124 and the object W is facilitated. To enhance this effect, if possible, pressure reduction is preferably performed from a partial space at a position where the gap is small. This is because at the position where the gap is small, air flows into the partial space a little, and pressure reduction can reliably be performed.

Figure 4:
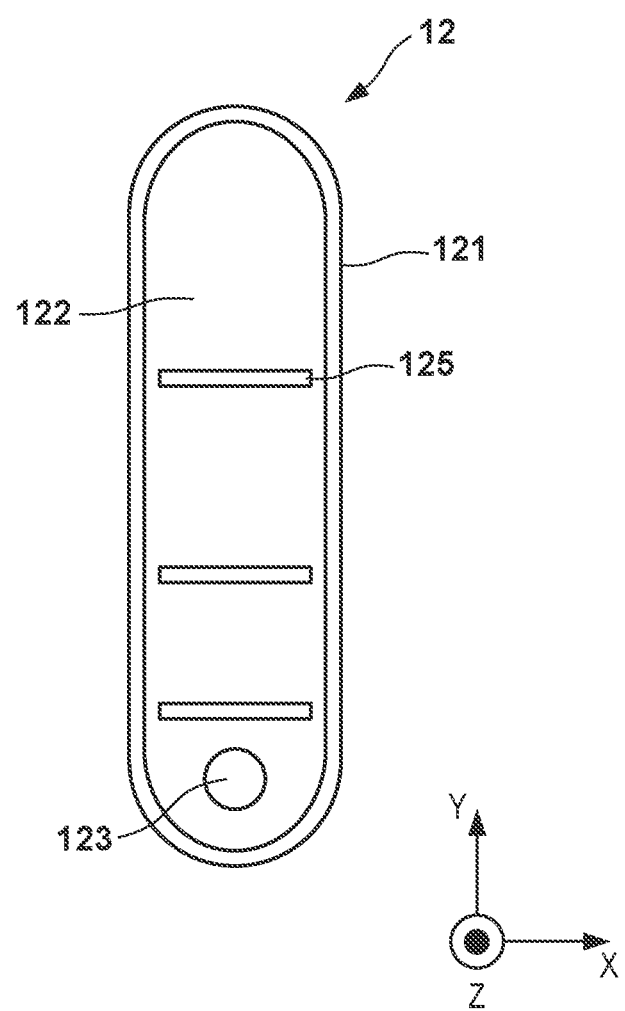
FIG. 4 is a schematic plan view showing another example of the configuration of the first attraction pad.
Figure 5A:
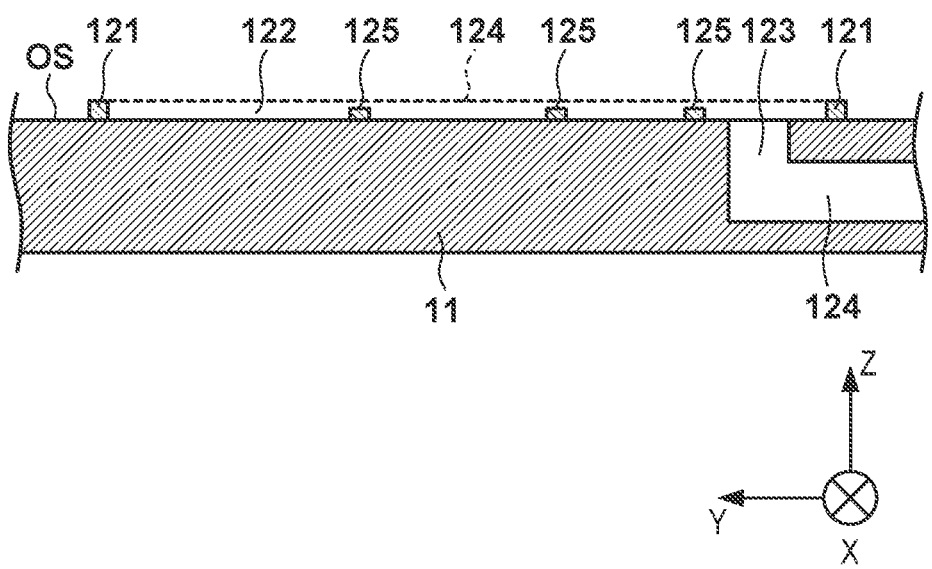
FIG. 5A is a schematic sectional view showing still another example of the configuration of the first attraction pad.
Figure 5B:
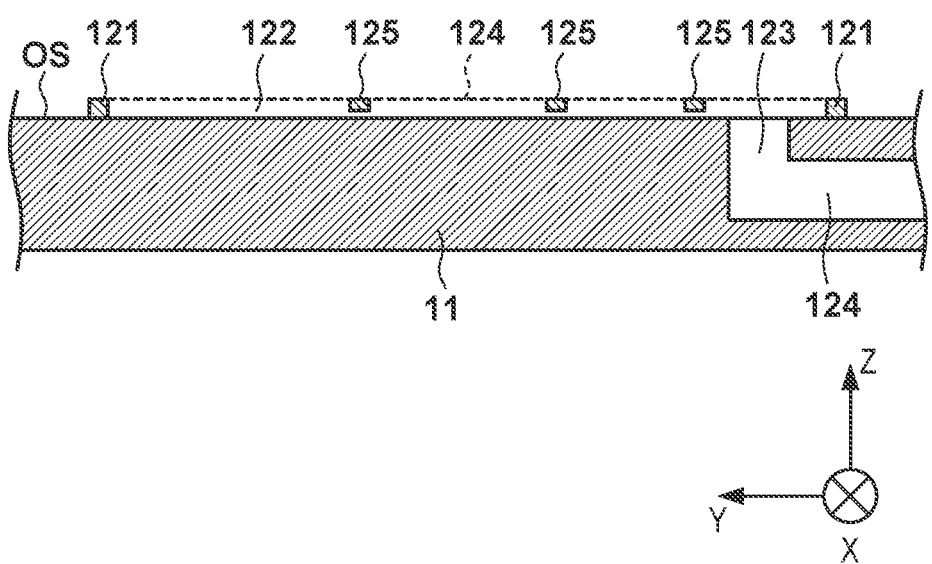
FIG. 5B is a schematic sectional view showing still another example of the configuration of the first attraction pad.

FIG. 4 schematically shows another example of the configuration of the obstructions 125 that restrict the flow of air. As shown in FIG. 4, gaps may be formed between the convex portion 121 and the obstructions 125, and the gaps may be used as channels. FIG. 5A schematically shows still another example of the configuration of the obstructions 125. As shown in FIG. 5A, gaps may be provided between the attraction surface 124 and the upper surfaces of the obstructions 125, and the gaps may be used as channels. In this case, when the attracted air flows in the direction of the attraction hole 123, a force for attracting the object W, like a Bernoulli chuck, can be generated. Also, in a state in which the attraction surface 124 and the object W are in surface contact, the spaces between the attraction surface 124 and the upper surfaces of the obstructions 125 also cause the attraction force to act on the object W by the negative pressure. FIG. 5B schematically shows still another example of the configuration of the obstructions 125. As shown in FIG. 5B, gaps may be provided between the obstructions 125 and a bottom surface that defines the lower surface of the attraction space 122, and the gaps may be used as channels.

The first attraction pad 12 and the second attraction pad 13 may be arranged at positions point-symmetric with respect to the gravity center position G of the object W, or may be arranged at positions that are not point-symmetric with respect to the gravity center position G of the object W. For example, the first attraction pad 12 and the second attraction pad 13 can be arranged such that the distance between the first attraction pad 12 and the gravity center position G becomes shorter than the distance between the second attraction pad 13 and the gravity center position G. In this case, the first attraction pad 12 can easily hold the object W, and the holding force necessary for the second attraction pad 13 to convey the object W can be made small.

The distance between the first attraction pad 12 and the second attraction pad 13 can be decided in accordance with the size of the object W, the degree of the warp and distortion, and the like. Here, the difference between the parallelism between the object W and the attraction surface 124 of the first attraction pad 12 and the parallelism between the object W and the attraction surface 134 of the second attraction pad 13 can become large as the distance between the first attraction pad 12 and the second attraction pad 13 increases.

The air channel 14 preferably has a shape that hardly causes the pressure loss in the air channel 14. This is because if the pressure loss hardly occurs, the flow amount of air increases, the attraction surface 124 can more easily come into surface contact with the object W, a high negative pressure can be ensured by the first attraction pad 12 and the second attraction pad 13, and a large holding force can be obtained. On the other hand, the pressure loss in the section from the branch portion of the air channel 14 to the second attraction pad 13 may be larger than the pressure loss in the section from the branch portion to the first attraction pad 12. Here, the branch portion is a portion where the channel common to the first attraction pad 12 and the second attraction pad 13 branches to the first attraction pad 12 and the second attraction pad 13. This configuration is advantageous in preferentially bringing the attraction surface 124 of the first attraction pad 12 into surface contact with the object W as compared to the attraction surface 134 of the second attraction pad 13. Also, this configuration is advantageous in preventing the first attraction pad 12 from receiving reduction of the negative pressure caused by the inflow of air to the attraction space 132 of the second attraction pad 13. The length of the air channel 14 from the attraction force supply source V1 to the second attraction pad 13 may be longer than the length of the air channel 14 from the attraction force supply source V1 to the first attraction pad 12.

Depending on the shape of the warp and distortion of the object W, the attraction surface 134 of the second attraction pad 13 may come into surface contact with the object W before the attraction surface 124 of the first attraction pad 12, and the attraction surface 124 of the first attraction pad 12 may be unable to come into surface contact with the object W. This can occur when, for example, the parallelism between the object W and the attraction surface 134 of the second attraction pad 13 is smaller than the parallelism between the object W and the attraction surface 124 of the first attraction pad 12 at the start of attraction. To avoid this, a gap forming portion may be provided on the convex portion 131 of the second attraction pad 13. The gap forming portion forms a gap between the object W and the convex portion 131 even if the second attraction pad 13 and the object W are in contact. The gap forming portion can be formed by, for example, providing a convex portion or a concave portion in the convex portion 131. Alternatively, the gap forming portion may be provided by increasing the flatness of the upper surface of the convex portion 131, and in an example, the flatness of the upper surface of the convex portion 131 of the second attraction pad 13 can be set to 0.005 or more. Alternatively, the flatness of the upper surface of the convex portion 131 of the second attraction pad 13 can be larger than the flatness of the upper surface of the convex portion 121 of the first attraction pad 12. This can reduce the attraction force of the second attraction pad 13 for the object W even if the parallelism between the attraction surface 134 and the object W is small. Even if the object W and the attraction surface 134 of the second attraction pad 13 are set in a state close to surface contact by reducing the attraction force of the second attraction pad 13 for the object W, the attraction surface 134 readily separates from the object W. Hence, the attraction surface 124 of the first attraction pad 12 readily comes into surface contact with the object W. According to this method, the attraction surface 124 of the first attraction pad 12 and the object W can more easily come into surface contact with each other. However, there is a tradeoff that the holding force of the second attraction pad 13 for the object W readily becomes small. For this reason, this method is not necessarily appropriate.

The base 11 can be made of, for example, a material such as a ceramic, metal, or plastic. The base 11 is preferably made of a material having little influence of deformation by the weight of its own, that is, a hard and lightweight material. More specifically, the base 11 can be made of alumina or SiC. The convex portions 121 and 131 of the first attraction pad 12 and the second attraction pad 13 can be made of, for example, a material such as a ceramic, metal, plastic, or rubber. The convex portions 121 and 131 of the first attraction pad 12 and the second attraction pad 13 are preferably made of a material of a high durability. Making the convex portion of a soft material is advantageous in facilitating surface contact between the attraction surface and the object W. Hence, if the durability conditions are satisfied, making the convex portion 121 of the first attraction pad 12 of a soft material with a wide elastic region, such as rubber, is advantageous. In addition, in a place where durability is demanded, the convex portion 121 of the first attraction pad 12 can be made of a hard ceramic or metal. More specifically, the convex portion 121 of the first attraction pad 12 can be made of a ceramic material such as alumina, SiC, or $TiO_2$, or a material such as SUS or aluminum. To avoid surface contact between the attraction surface 134 and the object W, the convex portion 131 of the second attraction pad 13 can be made of a hard material of a high durability, for example, a ceramic or metal. More specifically, the convex portion 131 of the second attraction pad 13 can be made of a ceramic such as alumina, SiC, or $TiO_2$, or a material such as SUS or aluminum.

Figure 6:
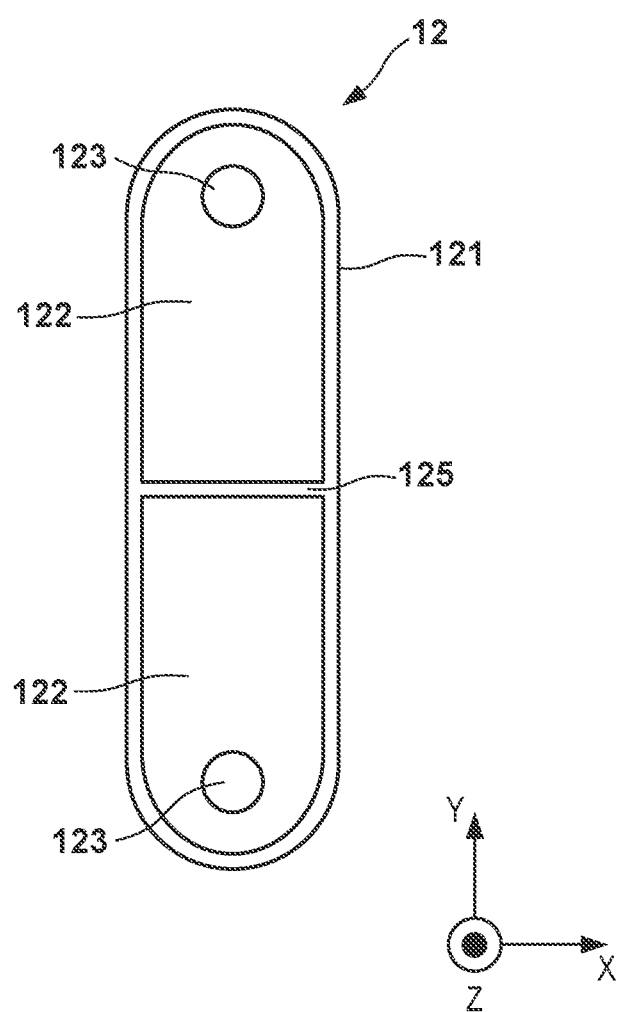
FIG. 6 is a schematic view showing a modification of the first attraction pad.

The number of attraction holes provided in each of the attraction pads 12 and 13 is not limited to one. For example, instead of providing the attraction hole 123 in the attraction pad 12, the attraction space 122 may directly communicate with the air channel 14. This is advantageous in reducing the pressure loss between the attraction space 122 and the air channel 14. Also, for example, a plurality of attraction holes may be provided in one attraction space 122. Accordingly, for example, even if the gap to the object W exists at any position of the attraction surface 124 at the start of attraction, the attraction surface 124 can easily be brought into surface contact with the object W. Also, for example, as shown in FIG. 6, the attraction space 122 of the attraction pad 12 may be divided into two or more partial spaces by the obstructions 125, and the attraction hole 123 communicating with the air channel 14 may be provided in each partial space. Here, the pressure loss in each of the plurality of attraction holes 123 may be adjusted.

Depending on the conveyance conditions, the holding force needed to convey the object can be small. In such a case, the second attraction pad 13 may be replaced with one or a plurality of contact support portions that support the object W by contact without attracting. In this case, the attraction surface 124 of the first attraction pad 12 can readily come into surface contact with the object W, and the decrease of the negative pressure in the attraction space 122 of the first attraction pad 12, which is caused by the inflow of air to the attraction space 132 of the second attraction pad 13, is eliminated. Hence, the holding force of the first attraction pad 12 can be improved. In this case, to hold the object W by a friction force according to the load of the object W, the one or plurality of contact support portions provided in place of the second attraction pad 13 preferably have a configuration with a high friction coefficient. The one or plurality of contact support portions can be formed by, for example, a member of rubber or the like. When the object W is supported by a contact support portion formed by a soft member of rubber or the like, the contact support portion is expanded/contracted in the Z direction by the load of the object W, and the repelling force changes in accordance with the expansion/contraction amount. Hence, the attraction surface 124 of the first attraction pad 12 and the object W can readily come into surface contact with each other at the time of attraction. The maximum size of the smallest regular polygon incorporating the attraction surface 124 of the first attraction pad 12 is preferably larger than the maximum size of the smallest regular polygon incorporating the one or plurality of contact support portions. Alternatively, the area of the smallest regular polygon incorporating the attraction surface 124 of the first attraction pad 12 is preferably larger than the area of the smallest regular polygon incorporating the one or plurality of contact support portions.

Figure 7:
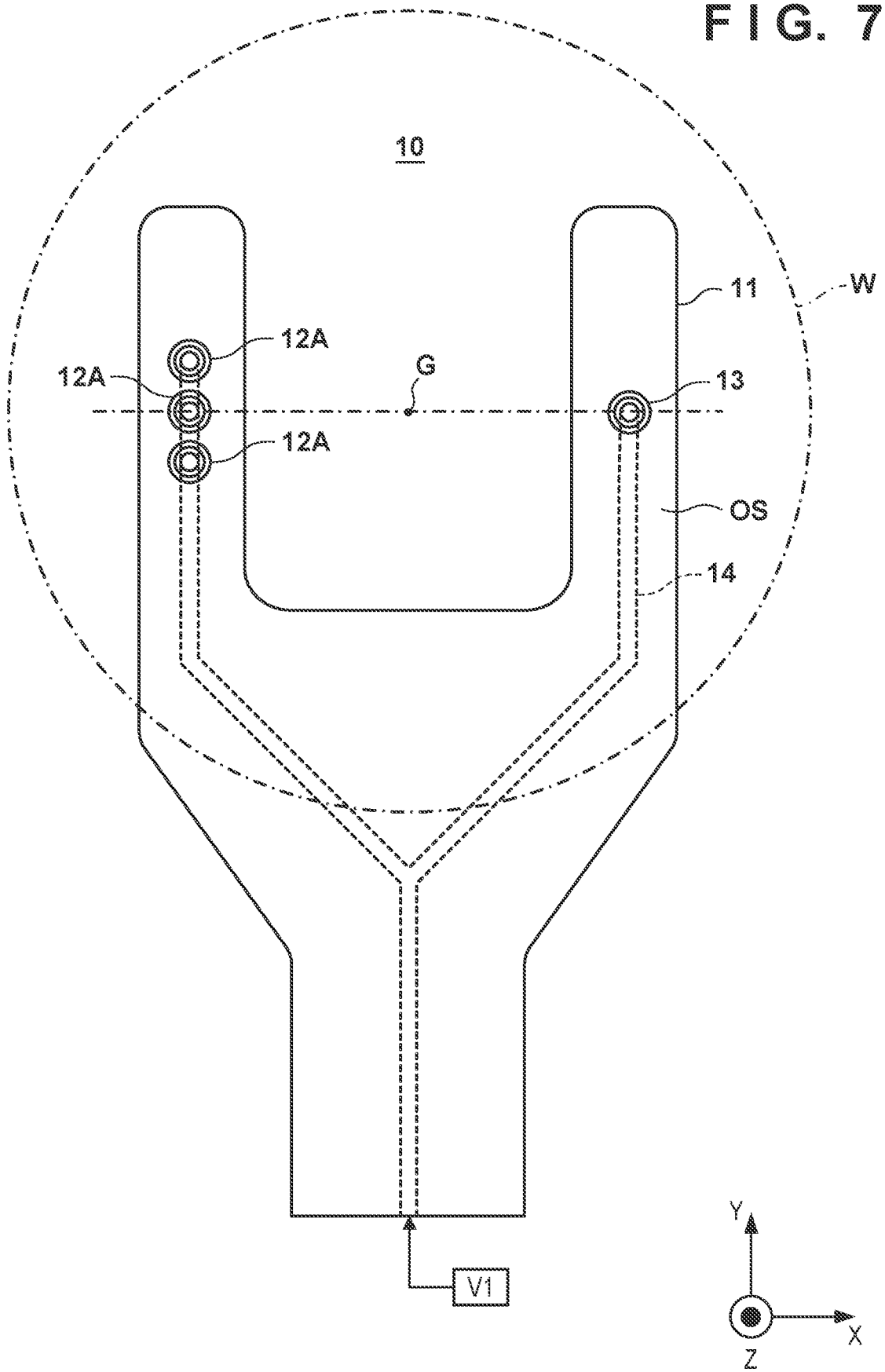
FIG. 7 is a schematic view showing a modification of the conveyance hand according to the embodiment.

The number of supports or attraction pads provided in the conveyance hand 10 is not limited to a specific number. For example, as shown in FIG. 7, the first attraction pad 12 may be replaced with a plurality of attraction pads 12A. The plurality of attraction pads 12A can form a first attraction holder, and the attraction pad 13 can form a second attraction holder. The maximum size of the smallest regular polygon incorporating the attraction surface of the first attraction holder is preferably larger than the maximum size of the smallest regular polygon incorporating the attraction surface of the second attraction holder. Alternatively, the area of the smallest regular polygon incorporating the attraction surface of the first attraction holder is preferably larger than the area of the smallest regular polygon incorporating the attraction surface of the second attraction holder. The maximum value of the attraction force that the first attraction holder applies to the object W is preferably larger than the maximum value of the attraction force that the second attraction holder applies to the object W. The plurality of attraction pads 12A that form the first attraction holder can be arranged close to each other. This is advantageous in suppressing lowering of the attraction force caused by forming the first attraction holder by the plurality of attraction pads 12A.

Figure 8:
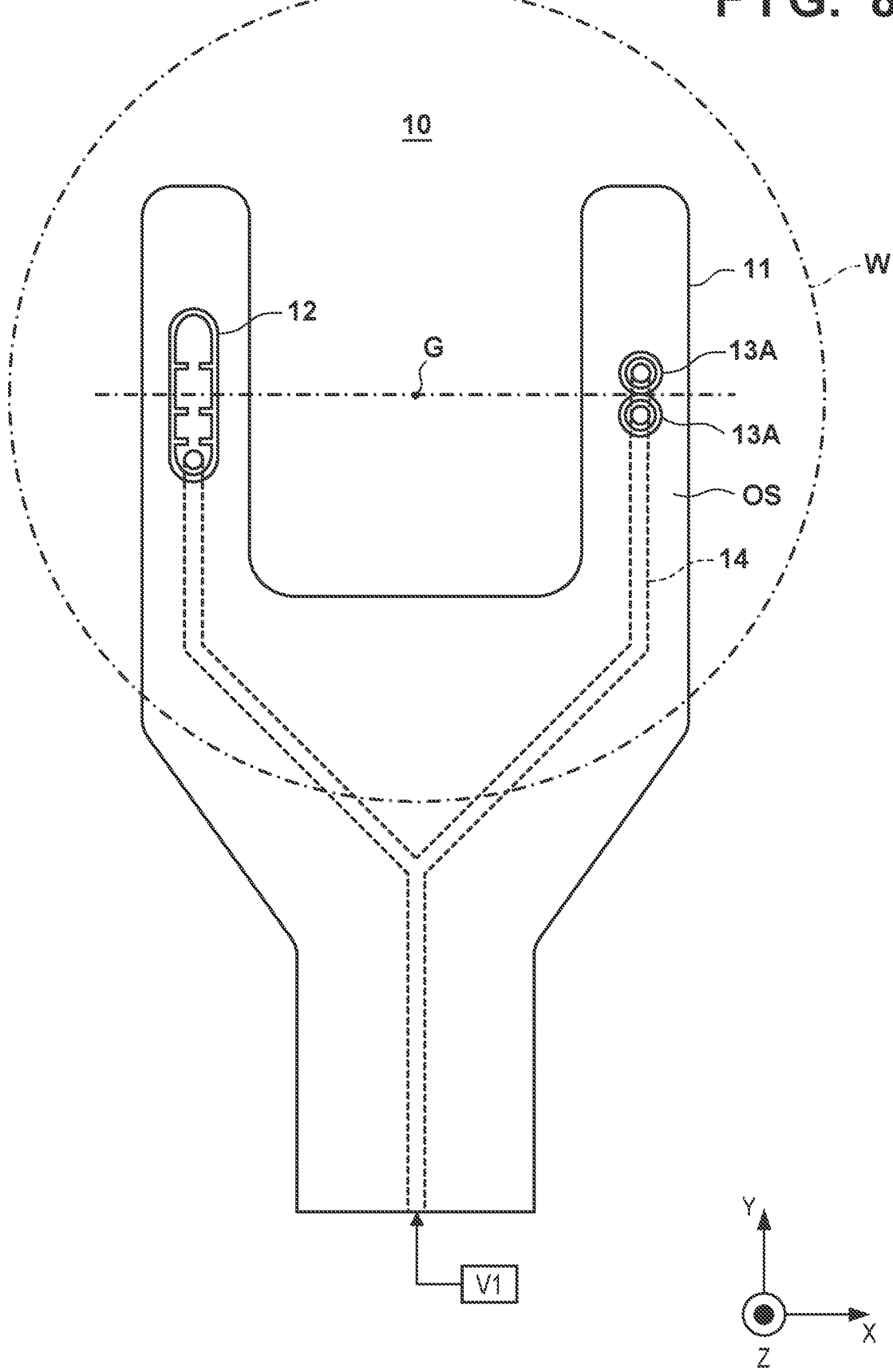
FIG. 8 is a schematic view showing another modification of the conveyance hand according to the embodiment.

For example, as shown in FIG. 8, the second attraction pad 13 may be replaced with a plurality of attraction pads 13A. In this case, the plurality of attraction pads 13A are preferably arranged close to each other. This can suppress the inflow amount of air to the plurality of attraction pads 13A to a predetermined amount or less at the time of attraction, and reduce the gaps between the object W and the attraction surfaces of the plurality of attraction pads 13A. Also, support of the object W by the first attraction pad 12 is facilitated. Hence, the plurality of attraction pads 13A can be caused to function like the second attraction pad 13.

In addition, some of the plurality of attraction pads 12A may be replaced with support members that are contact support portions having no attraction structure, or some or all of the plurality of attraction pads 13A may be replaced with support members that are contact support portions.

The conveyance hand 10 includes a plurality of supports, and the plurality of supports can include at least one attraction pad. The plurality of supports may be three or more supports. The plurality of supports can include one or a plurality of contact support portions in addition to one or a plurality of attraction pads.

If the plurality of attraction pads 13A are arranged, as shown in FIG. 8, it is preferable that the gap between the object W and the attraction surface of each of the plurality of attraction pads 13A is not too large. The size of the gap can depend on the distance between the support position of the object W by one attraction pad 13A and the support position of the object W by another attraction pad 13A. For this reason, if the distance between the plurality of attraction pads 13A is too long, the gap between the object W and the attraction surface of one of the plurality of attraction pad 13A becomes large, and inflow of air increases. Hence, the negative pressure cannot be ensured.

To ensure the negative pressure, the gap of a portion where the gap is largest is preferably suppressed to 40 μm or less, although it is affected by the shape of the attraction surface of the attraction pad or the flow amount of air attraction. The influence of the inflow of air on the negative pressure has examined using an attraction pad whose attraction surface has a circular shape (diameter=about 6 mm). As a result, in a configuration in which the gap of the largest portion was about 40 μm, as compared to a negative pressure in a state without a gap, it was confirmed that a negative pressure more than half was ensured.

An example in which a silicon wafer is conveyed as the object will be described here. The silicon wafer sometimes warps by a process such as exposure. As for this warp, the silicon wafer often warps almost in a circular shape from its center toward the outer periphery because of the shape and arrangement of a pattern. To obtain the effect of this embodiment, the plurality of supports can be arranged in two regions located across the center of the silicon wafer. In this case, the difference in the parallelism between the silicon wafer and the attraction surface or the like can be an amount almost proportional to the distance between the two regions, simply considering by neglecting the influence of the self-weight deformation of the base 11 or the silicon wafer. The gap between the attraction surface and the silicon wafer can be proportional to the difference in the parallelism. In a case of a silicon wafer having a large diameter of 8 or 12 inches, the distance between the two regions that support the silicon wafer can be long. A configuration advantageous in obtaining the effect of this embodiment will be considered concerning an 8-inch silicon wafer currently in high demand.

As a problem of the 8-inch silicon wafer, when a height difference of several hundred μm is generated by a warp, the conveyance hand cannot hold the silicon wafer. A case in which the silicon wafer has a warp of 200 μm will be considered here. For example, a case in which the plurality of attraction pads 13A are arranged, as in FIG. 8, will be considered. The distance between the attraction pad 12 and the plurality of attraction pads 13A is assumed to be 100 mm. Assume that the number of the plurality of attraction pads 13A is two, the distance between the two attraction pads 13A is 10 mm, and the outer diameter of the attraction surface of each attraction pad 13A is 5 mm. In this configuration, when the attraction pad 12 is brought into surface contact with the silicon wafer, the gap between the attraction pads 13A and the silicon wafer is 40 μm at maximum. That is, it is found that in the configuration as described above, the gap can be suppressed to 40 μm at maximum, and the effect of this embodiment can be obtained. Considering a case in which a large effect is to be obtained, or a case in which a larger warp amount needs to be dealt with, it is found that the distance between the two attraction pads 13A is preferably shorter.

This also applies to a case in which one of the two attraction pads 13A is replaced with a contact support portion, and the distance between the attraction pad 13A and the contact support portion is preferably 10 mm or less. In addition, if all of the plurality of attraction pads 13A are replaced with contact support portions, the silicon wafer may be supported by all the contact support portions, although there is no influence of the inflow of air. Hence, the distance between adjacent contact support portions is also preferably 10 mm or less. Note that more specifically, that the distance is 10 mm or less means that the distance ranges from 0 mm or 10 mm. That the distance is 0 mm means that the two contact support portions are in contact with each other.

In an embodiment, a plurality of supports configured to support an object to be transferred are arranged on a base, and the plurality of supports can include an attraction pad configured to attract and support the object, and a first contact support portion and a second contact support portion, which support the object by contact without attracting. The distance between the first contact support portion and the second contact support portion can be 10 mm or less. The attraction pad can be arranged at a position apart from the first contact support portion and the second contact support portion (for example, at a position apart by 20 mm or more, 30 mm or more, 40 mm or more, 50 mm or more, 60 mm or more, 70 mm or more, 80 mm or more, 90 mm or more, or 100 mm or more).

The attraction method used by the conveyance hand 10 to attract the object W is not limited to vacuum attraction. For example, a Bernoulli chuck or an electromagnetic chuck may be used as the attraction method. Even in use of the Bernoulli chuck or electromagnetic chuck, if the distance between the object W and the attraction surface deviates from the optimum distance due to the warp and distortion of the object W, the attraction force decreases. When the size of one attraction pad is made smaller than the size of the other attraction pad, the distance between the object W and the attraction surface of the one attraction pad does not increase, and the decrease of the attraction force can be suppressed.

Here, a projecting portion whose height in the Z direction is lower than that of the attraction surface 124 and the attraction surface 134 may be provided on the base 11. When the object W is placed on the conveyance hand 10, or when attraction is started, if the object W moves due to a vibration or the like, the projecting portion can exert a function of stopping or attenuating the movement. The projecting portion is preferably located at such a height and position that can stop the movement of the object W and does not support the object W. Also, the projecting portion can be made of a soft material such as rubber so as to easily stop or attenuate the movement without damaging the object.

Here, as in Japanese Patent Application No. 2017-107066, each of the first attraction pad 12 and the second attraction pad 13 may have a structure that conforms the structure of the attraction surface to the object. For example, even if only the first attraction pad 12 has the structure as in Japanese Patent Application No. 2017-107066, the air inflow amount to the second attraction pad 13 decreases, and the effect as in the embodiment can be obtained. Also, in this case, since only the first attraction pad 12 is configured thick, depending on the entire apparatus configuration, it may be possible to prevent a physical interference at the position of the second attraction pad 13. Furthermore, the second attraction pad 13 may be replaced with a contact support portion.

Figure 9:
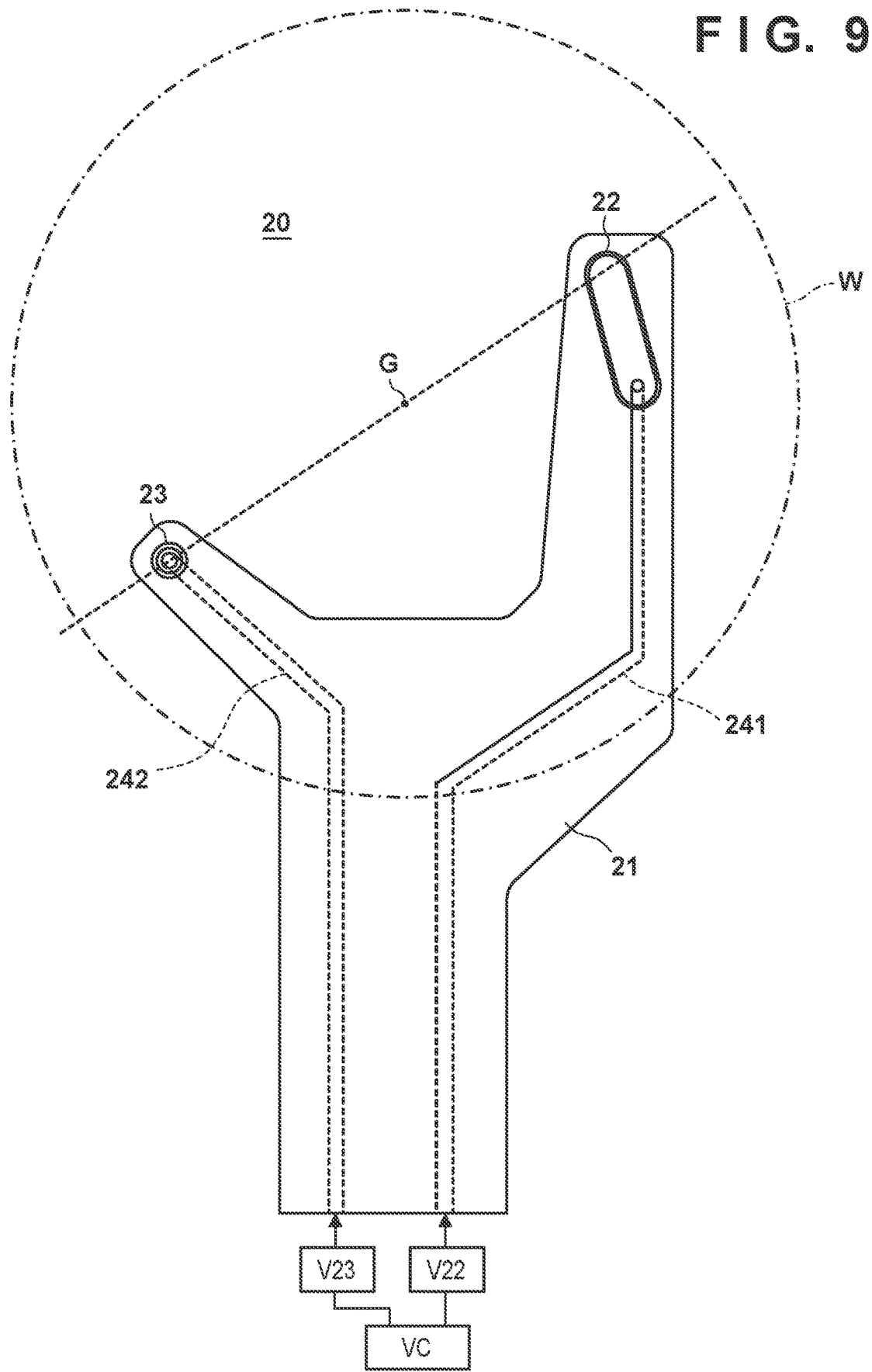
FIG. 9 is a schematic view showing the configuration of a conveyance hand according to another embodiment.

FIG. 9 is a view showing the configuration of a conveyance hand 20 according to another embodiment. The conveyance hand 20 can be attached to the movable portion of a conveyance apparatus that conveys an object W to be transferred (object). The object W can be, for example, a substrate such as a wafer used to manufacture a semiconductor device or a glass plate used to manufacture a liquid crystal display device. The conveyance hand 20 holds the object W by attracting the object W.

As shown in FIG. 9, the conveyance hand 20 can include a base 21 that forms the main body of the conveyance hand 20, and a first attraction pad 22 and a second attraction pad 23, which serve as a plurality of supports arranged on the base 21. The conveyance hand 20 can include a line configured to give an attraction force to the first attraction pad 22 and the second attraction pad 23. The line can include a first air channel 241 that communicates with the first attraction pad 22, and a second air channel 242 that communicates with the second attraction pad 23. A first attraction force supply source V22 can be connected to the first air channel 241. A second attraction force supply source V23 can be connected to the second air channel 242. The first attraction force supply source V22 and the second attraction force supply source V23 can be controlled by an attraction control unit VC. The first attraction pad 22 and the second attraction pad 23 can come into contact with the back surface of the object W to support the object W and apply an attraction force by a negative pressure to the object W. In the first attraction pad 22, to generate an attraction force larger than that of the second attraction pad 23, the area of an attraction space that forms the negative pressure for attraction is larger than that in the second attraction pad 23. In addition, the size of the first attraction pad 22 in a direction parallel to the X-Y plane is larger than that of the second attraction pad 23.

When holding the object W by the conveyance hand 20, the first attraction pad 22 and the second attraction pad 23 attract the object W by negative pressures supplied from individual air channels and attraction force supply sources. Since the first air channel 241 and the second air channel 242 are independent, even if inflow of air occurs in the first attraction pad 22 and the second attraction pad 23, pressure reduction in the attraction pad in which inflow of air does not occur is not affected by this. Hence, if surface contact with the object W occurs on the first attraction pad 22, the object W can be attracted by a pressure close to the achieved pressure of the first attraction force supply source V22, that is, a high negative pressure. Hence, the first attraction pad 22 can stably attract the object W by a high attraction force that does not depend on the inflow amount of air to the second attraction pad 23.

First, attraction by the first attraction pad 22 can be started such that the first attraction pad 22 comes into surface contact with the object W before the second attraction pad 23. After the first attraction pad 22 comes into surface contact with the object W, attraction by the second attraction pad 23 can be started. This allows the first attraction pad 22 to easily come into surface contact with the object W. Also, the second attraction pad 23 need not intentionally take a means for preventing surface contact first. For example, it is unnecessary to increase the flatness of the attraction surface of the second attraction pad 23. This is because when the first attraction pad 22 comes into surface contact with the object W, the attraction by the second attraction pad 23 hardly disturbs maintaining of the surface contact between the first suction pad 22 and the object W.

As a method of performing attraction by the second attraction pad 23 after the surface contact between the first attraction pad 22 and the object W, for example, a method of determining surface contact by the pressure of the first attraction force supply source V22 or the like can be used. When the first attraction pad 22 and the object W come into surface contact, the pressure in some of the first attraction pad 22, the first air channel 241, and the first attraction force supply source V22 continuously lowers up to the achieved pressure. Here, when a sensor configured to detect the pressure in these sections is provided, and the pressure lowers to a predetermined threshold or less, the attraction control unit VC can determine that surface contact between the first attraction pad 22 and the object W has occurred. After determining that surface contact between the first attraction pad 22 and the object W has occurred, the attraction control unit VC can start air attraction by the second attraction force supply source V23. It is therefore possible to start attraction by the second attraction pad 23 after the surface contact between the first attraction pad 22 and the object W. Alternatively, the attraction control unit VC may start air attraction by the second attraction force supply source V23 after a predetermined time from the start of air attraction by the first attraction force supply source V22. Such control is advantageous in reducing cost because the sensor configured to detect the pressure is unnecessary. Here, setting a relatively long time difference for starting attraction is advantageous in stabilizing the operation but disadvantageous from the viewpoint of throughput. Hence, the time difference for starting attraction can be decided in consideration of the application purpose.

In the other embodiment, the number of attraction pads need not limited to two. In addition, the number of air channels and the number of attraction force supply sources need not limited to two. For example, when three or more attraction pads and individual air channels and attraction force supply sources as many as the number of attraction pads are provided, inflow of air to a certain attraction pad does not affect the other attraction pads. Also, for example, the attraction effect can be enhanced by providing a plurality of attraction holes and individual air channels and attraction force supply sources for the attraction holes at appropriate positions of one attraction pad. If a plurality of attraction pads are arranged close, the plurality of attraction pads arranged close may be controlled by one independent air channel and one independent attraction force supply source, or may be controlled by individual air channels and attraction force supply sources as many as the attraction pads.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-211562, filed Dec. 21, 2020, which is hereby incorporated by reference herein in its entirety.

What is claimed is:
1. A conveyance hand configured to convey an object, comprising:
  a base; and
  first and second attraction pads arranged on the base and configured to attract the object, wherein the second attraction pad is configured to attract the object by a force weaker than the first attraction pad, wherein the first and second attraction pads are arranged such that a center of gravity of the object is located between the first attraction pad and the second attraction pad, wherein the first attraction pad is elongated in a direction intersecting a line passing through a center of the first attraction pad and a center of the second attraction pad, and wherein a size of the second attraction pad in the direction is smaller than a size of the first attraction pad in the direction.

2. The conveyance hand according to claim 1, wherein the base includes a facing surface that faces the object in a state in which the object is supported by the first and second attraction pads, and a maximum size of the second attraction pad in a direction parallel to the facing surface is smaller than the first attraction pad.

3. The conveyance hand according to claim 1, wherein an area surrounded by an outer edge of a region where the second attraction pad comes into contact with the object is smaller than an area surrounded by an outer edge of a region where the first attraction pad comes into contact with the object.

4. The conveyance hand according to claim 1, wherein the first attraction pad includes a convex portion configured to surround an attraction space in which a pressure is reduced for attraction of the object.

5. The conveyance hand according to claim 4, wherein the first attraction pad further includes an obstruction arranged in the attraction space.

6. The conveyance hand according to claim 5, wherein the obstruction is arranged to define, in the attraction space, a plurality of partial spaces partially partitioned from each other by the obstruction.

7. The conveyance hand according to claim 1, wherein the second attraction pad includes a gap forming portion configured to form a gap to the object even if the second attraction pad and the object come into contact.

8. The conveyance hand according to claim 1, wherein the attraction of the object by the first attraction pad and the attraction of the object by the second attraction pad are individually controlled.

9. A conveyance hand configured to convey an object, comprising:

a base; and a plurality of supports arranged on the base and configured to support the object, wherein the plurality of supports include an attraction pad configured to attract the object by an attracting force, and a contact support portion configured to support the object by contact without attracting the object with an attracting force, wherein an area surrounded by an outer edge of a region where the contact support portion comes into contact with the object is smaller than an area surrounded by an outer edge of a region where the attraction pad comes into contact with the object, wherein the attraction pad and the contact support portion are arranged such that a center of gravity of the object is located between the attraction pad and the contact support portion, wherein the contact support portion is elongated in a direction intersecting a line passing through a center of the attraction pad and a center of the contact support portion, and wherein a size of the contact support portion in the direction is smaller than a size of the attraction pad in the direction.

10. The conveyance hand according to claim 9, wherein the base includes a facing surface that faces the object in a state in which the object is supported by the plurality of supports, and a maximum size of the contact support portion in a direction parallel to the facing surface is smaller than the attraction pad.

11. The conveyance hand according to claim 9, wherein the attraction pad includes a convex portion configured to surround an attraction space in which a pressure is reduced for attraction of the object.

12. The conveyance hand according to claim 11, wherein the attraction pad further includes an obstruction arranged in the attraction space.

13. The conveyance hand according to claim 12, wherein the obstruction is arranged to define, in the attraction space, a plurality of partial spaces partially partitioned from each other by the obstruction.

* * * * *